(12) United States Patent
Lambrecht

(10) Patent No.: US 8,378,481 B2
(45) Date of Patent: Feb. 19, 2013

(54) SEMICONDUCTOR MODULE WITH MICRO-BUFFERS

(75) Inventor: Frank Lambrecht, Mountain View, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 13/420,341

(22) Filed: Mar. 14, 2012

(65) Prior Publication Data

US 2012/0181704 A1    Jul. 19, 2012

Related U.S. Application Data

(63) Continuation of application No. 12/523,029, filed as application No. PCT/US2008/053082 on Feb. 5, 2008, now Pat. No. 8,143,720.

(60) Provisional application No. 60/888,489, filed on Feb. 6, 2007.

(51) Int. Cl.
*H01L 23/34* (2006.01)
*H01L 21/00* (2006.01)

(52) U.S. Cl. ......... 257/723; 257/E23.169; 257/E21.705; 438/107

(58) Field of Classification Search .................. 257/723, 257/725, E23.169, E23.174
See application file for complete search history.

(56) References Cited

U.S. PATENT DOCUMENTS

| | | | |
|---|---|---|---|
| 3,999,105 A | 12/1976 | Archey et al. ................. | 317/100 |
| 5,272,664 A | 12/1993 | Alexander et al. ............. | 365/52 |
| 5,297,107 A | 3/1994 | Metzger et al. ............... | 361/778 |
| 5,818,107 A | 10/1998 | Pierson et al. ................ | 257/723 |
| 5,841,686 A | 11/1998 | Chu et al. ...................... | 365/51 |
| 5,982,654 A | 11/1999 | Corisis ........................... | 365/63 |
| 6,434,016 B2 | 8/2002 | Zeng et al. .................... | 361/760 |
| 6,449,166 B1 | 9/2002 | Sly et al. ....................... | 361/760 |
| 6,530,006 B1 | 3/2003 | Dodd et al. .................... | 711/167 |
| 6,553,450 B1 | 4/2003 | Dodd et al. .................... | 711/105 |
| 6,650,588 B2 | 11/2003 | Yamagata ...................... | 365/222 |
| 6,683,372 B1 * | 1/2004 | Wong et al. .................... | 257/686 |
| 6,697,888 B1 | 2/2004 | Halbert et al. ................. | 710/52 |
| 6,747,887 B2 * | 6/2004 | Halbert et al. ................. | 365/51 |
| 6,947,304 B1 * | 9/2005 | Yen ................................ | 365/63 |
| 6,967,411 B2 | 11/2005 | Eide ............................... | 257/781 |
| 7,000,062 B2 | 2/2006 | Perego et al. .................. | 711/5 |
| 7,010,642 B2 | 3/2006 | Perego et al. .................. | 711/5 |
| 7,017,002 B2 | 3/2006 | Perego et al. .................. | 711/5 |
| 7,032,392 B2 | 4/2006 | Koeneman et al. ............ | 62/77 |
| 7,051,151 B2 | 5/2006 | Perego et al. .................. | 711/5 |
| 7,064,003 B2 | 6/2006 | Wallace ......................... | 438/106 |

(Continued)

FOREIGN PATENT DOCUMENTS

DE   10 2006 022026 A1   11/2006
GB      2 422 963 A         8/2006

(Continued)

OTHER PUBLICATIONS

International Search Report and Written Opinion issued in PCT/US2008/053082, Jun. 25, 2008, 9 pages by ISA/EP.

(Continued)

*Primary Examiner* — Lex Malsawma

(74) *Attorney, Agent, or Firm* — Morgan, Lewis & Bockius LLP

(57) ABSTRACT

The semiconductor module includes a plurality of memory die on a first side of a substrate and a plurality of buffer die on a second side of the substrate. Each of the memory die is disposed opposite and electrically coupled to one of the buffer die.

13 Claims, 6 Drawing Sheets

U.S. PATENT DOCUMENTS

| | | | |
|---|---|---|---|
| 2002/0185717 A1 | 12/2002 | Eghan et al. | 257/678 |
| 2004/0047170 A1 | 3/2004 | Lee | 365/63 |
| 2004/0190365 A1* | 9/2004 | Ellis et al. | 365/233 |
| 2004/0236901 A1 | 11/2004 | Briggs | 711/105 |
| 2005/0210196 A1 | 9/2005 | Perego et al. | 711/115 |
| 2006/0255459 A1 | 11/2006 | Muff et al. | 257/738 |
| 2007/0070669 A1 | 3/2007 | Tsern | 365/51 |
| 2007/0250658 A1 | 10/2007 | Lee et al. | 711/1 |

FOREIGN PATENT DOCUMENTS

| | | |
|---|---|---|
| KR | 1020050091446 A | 9/2005 |

OTHER PUBLICATIONS

International Preliminary Examination Report dated Apr. 27, 2011 re Int'l. Application No. PCT/US08/53082, 6 pgs.

* cited by examiner

US 8,378,481 B2

SEMICONDUCTOR MODULE WITH MICRO-BUFFERS

CROSS REFERENCE TO RELATED APPLICATIONS

This Application is a continuation of U.S. application Ser. No. 12/523,029 filed Jul. 13, 2009 now U.S. Pat. No. 8,143,720 which claims priority to United States National Stage Application filed under 35 U.S.C. §371 of PCT Patent Application Serial No. PCT/US2008/053082 filed on Feb. 5, 2008, which claims the benefit of and priority to U.S. Provisional Patent Application Ser. No. 60/888,489 filed on Feb. 6, 2007, the disclosures of all of which are hereby incorporated by reference in their entirety.

BACKGROUND

The disclosure herein relates to semiconductor modules. More specifically, the disclosure is directed toward a semiconductor module that includes multiple memory die and at least one buffer die, all mounted on a common substrate.

Some conventional memory modules include multiple semiconductor memory die electrically coupled to a buffer die, where the multiple memory die and the buffer die are typically aligned in a linear configuration on a circuit board. This linear configuration, however, results in electrical interconnections of different lengths between the buffer die and each of the memory die. These differences in the lengths of the interconnections may skew the transmission signals to and from the various memory die, i.e., affect the timing or phase of the transmission signals. This skew is particularly problematic for high speed transmission signals. In addition, the linear configuration of the memory die and buffer die results in a larger than desired footprint on the circuit board.

One method of achieving a smaller footprint while increasing the number of memory die is to stack memory die on top of the buffer die. However, this method impedes heat dissipation at each memory die and buffer die. Still further, a stacked configuration increases the thickness of the module, which is of particular concern in smaller computing systems, such as laptop and notebook computers.

As such, it would be highly desirable to provide a semiconductor module that includes buffered signal transmission to multiple memory die, while addressing the aforementioned drawbacks of conventional modules.

BRIEF DESCRIPTION OF THE DRAWINGS

For a better understanding of the disclosure herein, reference should be made to the following detailed description taken in conjunction with the accompanying drawings, in which.

Like reference numerals refer to the same or similar components throughout the several views of the drawings.

DETAILED DESCRIPTION OF THE EMBODIMENTS

Some of the exemplary embodiments described below address the problems discussed in the background section above by providing memory die and buffer die mounted on both sides of a substrate, where at least the high speed interconnections between each memory die and its corresponding buffer die have substantially the same lengths. In some embodiments, the memory die and buffer die are distributed to maximize cooling without the need for long interconnections.

In some embodiments, the semiconductor module includes a substrate having opposing first and second substantially planar sides. The module also includes multiple memory die mechanically coupled to the first side of the substrate, and multiple buffer die mechanically coupled to the second side of the substrate. Each of the buffer die is disposed opposite and electrically coupled to a respective one of the memory die.

In other embodiments, the semiconductor module includes a substrate having opposing first and second substantially planar sides. The module also includes multiple memory die mechanically coupled to the first side of the substrate and disposed substantially in a row, and an elongate buffer die mechanically coupled to the first side of the substrate adjacent to and electrically connected to each of the memory die in the row.

In other embodiments, the semiconductor module includes a substrate having opposing first and second substantially planar sides. The module also includes one or more memory die mechanically coupled to each of the first and second sides of the substrate. In addition, the module includes a buffer die mechanically coupled to the first side of the substrate and electrically connected to all of the memory die.

The semiconductor module may also comprise a substrate having opposing first and second substantially planar sides, multiple memory die mechanically coupled to the first side of the substrate, and at least one buffer die mechanically coupled to the first side of the substrate and electrically connected to the memory die. In these embodiments, the memory die are equidistant from the buffer die.

Figure 1A:
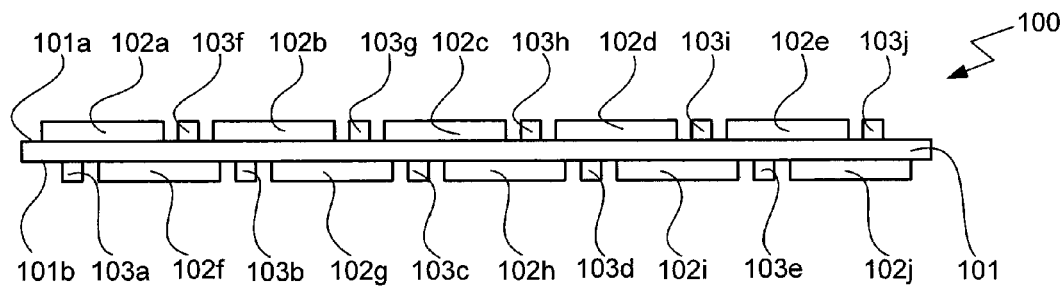
FIG. 1A is a top view of a semiconductor module according to an embodiment described herein.

FIG. 1A is a top view of a memory module 100, such as, without limitation, a Singe Inline Memory Module (SIMM), a Dual Inline Memory Module (DIMM), or a Registered DIMM. The module 100 includes a substrate 101 having a first side 101a and a second side 101b. The first side 101a and second side 101b are opposite to one another and are substantially planar. The substrate 101 may be a circuit board, e.g., a printed circuit board, a printed wire board, a board mounting a flexible printed circuit tape, or the like.

In some embodiments, such as, for example, for dual rank applications, a first row of memory die 102a-102e is mechanically coupled to the first side 101a of the substrate 101. In some embodiments, the memory die 102a-102e define a first rank of memory devices. In some embodiments, a second row of memory die 102f-102j is mechanically coupled to the second side 101b of substrate 101, and, in some embodiments, defines a second rank of memory devices. While ten memory die 102a-102j are shown for illustrative purposes, any number of memory die may be used. The memory die 102a-102j may be semiconductor memory devices, such as, without limitation, dynamic random access memory (DRAM) in the form of synchronous DRAM (SDRAM), double data rate SDRAM (DDR), DDR2, DDRn, graphics memory such as graphics DDR (GDDR), GDDR2, GDDRn, Rambus DRAM (RDRAM), or flash memory such as NOR, burst NOR, synchronous NOR, or NAND.

Figure 1B:
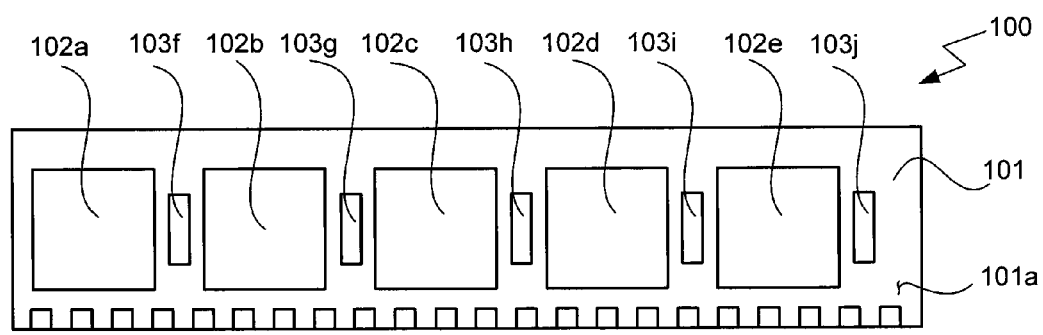
FIG. 1B is a side view of a first side of the semiconductor module shown in FIG. 1A.
Figure 1C:
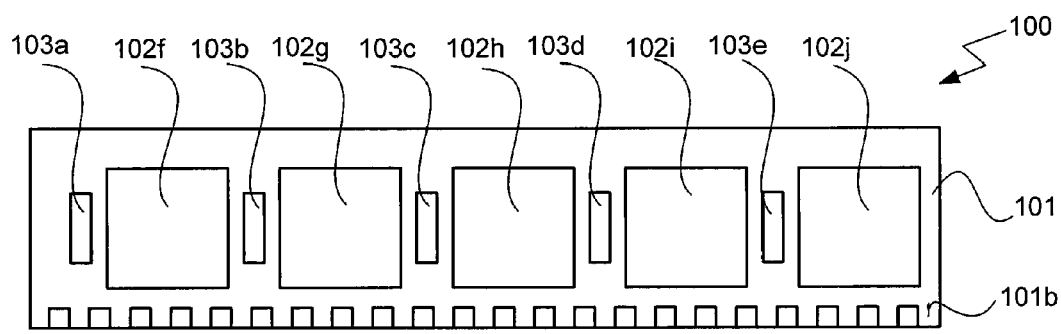
FIG. 1C is a side view of a second side of the semiconductor module shown in FIG. 1A.

In some embodiments, the semiconductor module 100 further includes a first row of buffer die 103a-103e mechanically coupled to the second side 101b of the substrate 101, and a second row of buffer die 103f-103j mechanically coupled to the first side 101a of the substrate 101. The number of buffer die 103a-103j may be equal to the number of memory die 102a-102j. Also in some embodiments, the buffer die 103f-103j are disposed on the first side 101a of the substrate 101 in an alternating pattern with the memory die 102a-102e. Similarly, the buffer die 103a-103e may be disposed on the second side 101b of the substrate 101 in an alternating pattern with the memory die 102f-102j. This arrangement is configured such that each memory die is electrically coupled to a corresponding buffer die disposed on the opposite side of the substrate 101. In some embodiments, each buffer die is disposed as close as possible to the center of the corresponding memory die on the opposite side of the substrate. This arrangement is further illustrated in FIGS. 1B and 1C.

In some embodiments, buffer die 103a-103e are electrically coupled to memory die 102a-102e, respectively, and buffer die 103f-103j are electrically coupled to memory die 102f-102j, respectively. In some embodiments, each memory die is electrically coupled to at least one buffer die disposed on the opposite side of the substrate to the memory die.

In some embodiments, referring again to FIG. 1A, each buffer die 103a-103j is disposed opposite the memory die 102a-102j to which it is electrically coupled, i.e., each memory die is electrically coupled to a single buffer die disposed closest to that memory die on the opposite side of the substrate 101 to the memory die. This is further explained with reference to FIG. 1D.

Figure 1D:
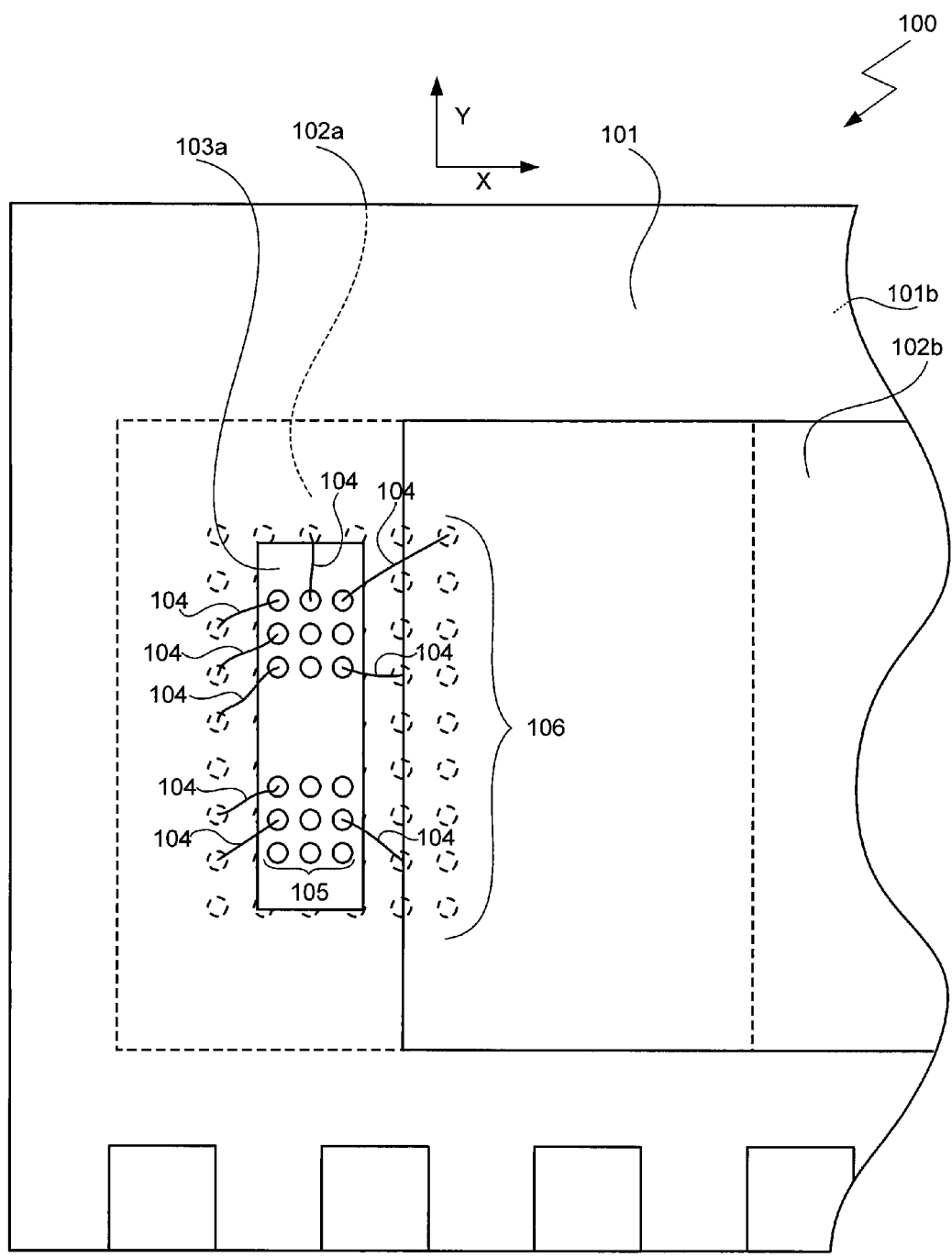
FIG. 1D is a detailed view of a portion of the second side of the semiconductor module shown in FIG. 1C.

FIG. 1D illustrates a portion of the substrate 101 with a representative memory die 102a and buffer die 103a. FIG. 1D shows a single memory die/buffer die pair for illustrative purposes only. The memory die 102a is disposed on the opposite side of the substrate 101 to the buffer die 103a, and, therefore, is shown in broken lines. In some embodiments, as described above, the memory die 102a is mechanically coupled to the first side 101a of the substrate 101. In some embodiments, the buffer die 103a is mechanically coupled to the second side 101b of the substrate 101 opposite the memory die 102a. In some embodiments the buffer die 103a and the memory die 102a are aligned vertically (along the Y-axis) and horizontally (along the X-axis), i.e., their centers are colinear. In other embodiments, as shown, the buffer die 103a may be offset from the center of the memory die 102a to more efficiently arrange the memory die and buffer die on each side of the substrate 101. In some embodiments, the buffer die 103a is electrically coupled to the memory die 102a through interconnections 104 and vias that extend through the substrate 101.

The buffer die 103a and the memory die 102a may each have multiple input/output connectors 105 and 106, respectively. These connectors 105 and 106 may be pads, pins, or the like. At least some of the buffer die connectors 105 are electrically connected to at least some of the memory die connectors 106 through the interconnections 104 to provide communication between the buffer die 103a and the memory die 102a.

In some embodiments, the interconnections 104 include wire bonds, as shown, using wire made of gold, aluminum, copper, or any other suitable electrically conductive material bonded to the connectors 105 and 106, such as by ball bonding, wedge bonding, or the like. In some embodiments, the wire bonds may be disposed over the top of the buffer die 103a, as shown, while in some embodiments, the wire bonds may connect underneath the buffer die 103a, i.e., between the buffer die 103a and the substrate 101.

In some embodiments, the interconnections 104 include electrically conductive signal traces ("traces," not shown) on the surface of the substrate and/or electrically conductive vias (not shown). The traces may be disposed parallel to the planar sides of the substrate 101, such as on the surface of the substrate 101 or within the one or more layers of the substrate 101. The traces may be formed using photolithography, laser etching, or other methods. The traces may be composed of various electrically conductive materials, such as copper or the like.

The vias may be disposed through the substrate 101, i.e., substantially perpendicular to the planar surfaces of the substrate 101. Each via forms an electrically conductive connection path through the substrate 101, and generally includes a central, or "drill" portion, an upper pad, and a lower pad. The vias may be formed using a number of techniques, such as mechanical drilling, laser drilling, or photolithographic techniques. After via holes have been formed in the substrate, one or more electrically conductive materials, such as copper or the like, are deposited into the holes. The electrically conductive material may fill the holes completely, or it may only line the via holes, leaving a hollow space in the electrically conductive material. In the case where the electrically conductive material only lines the via holes, the hollow space within the vias may be filled with various dielectric materials, or it may remain hollow. The electrically conductive material may be applied or deposited in the via holes using a number of different techniques, including plating or paste filling. The vias may be directly coupled to the connectors 105, 106, or may be coupled to the connectors 105, 106 through interconnections, such as wires or traces (not shown).

The interconnections 104 may be designed such that their electrical characteristics are all substantially the same. For example, the inductance and impedance of each interconnection may be selected to be similar by selecting the appropriate lengths, material, and thickness of the traces (not shown) or wire bonds. The same or different materials may also be selected to ensure that the interconnections have the same or similar inductance and impedance. Also, the width or diameter of the vias may be selected to ensure impedance and inductance matching.

In some embodiments, the lengths of the interconnections 104 are between approximately 0.5-2 mm, and in some embodiments, approximately 1 mm Since the substrate 101 may have a substantially uniform thickness and the buffer die 103a may be substantially collinear with the memory die 102a, the wire bonds and/or vias (not shown) may be selected to have substantially the same characteristics, like size, shape, lengths, and other electrical characteristics. This avoids problems such as impedance mismatch and skew, thereby providing excellent signal integrity. This signal integrity is particularly important for high-speed signal paths that are more susceptible to skew.

Since, as seen in FIGS. 1A-1D, the buffer die 103*a* is generally smaller than the memory die 102*a*, interconnection lengths as small as 1 mm may not be possible for every pin 106. Therefore, in some embodiments, the buffer die 103*a* is disposed near those connectors 106 that utilize high-speed signals, compared to the remainder of the connectors 106. For example, the buffer die 103*a* may be disposed opposite data connectors 106, while command connectors 106 are disposed farther away from the buffer die 103*a*. Interconnection lengths 104 can thus be optimized at the higher-speed connectors 106, where skew and impedance mismatching should especially be avoided.

While lengths of the interconnections 104 are of particular concern, length and other characteristics can be adjusted to "tune" for other desired electrical characteristics such as impedance and inductance. For example, long interconnections 104 can be provided even for those of connectors 105, 106 that are near each other by providing interconnections 104 that are not linear, such as by providing arced, spiral, or otherwise non-linear wire bonds, traces, etc. In addition, thickness, material, and other characteristics of the interconnections 104 can be selected to provide any desired electrical characteristics.

Figure 2A:
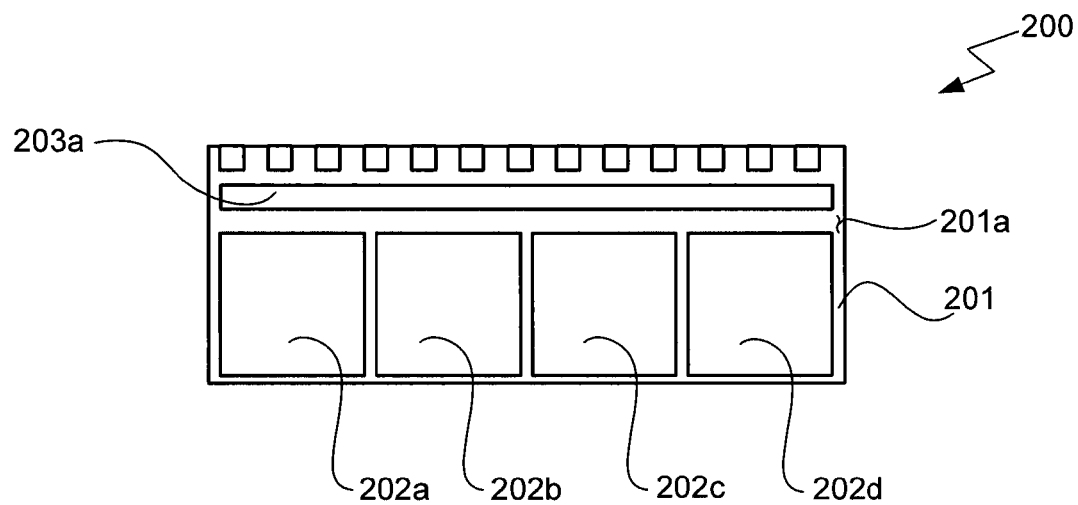
FIG. 2A is a side view of a first side of a semiconductor module according to another embodiment.
Figure 2B:
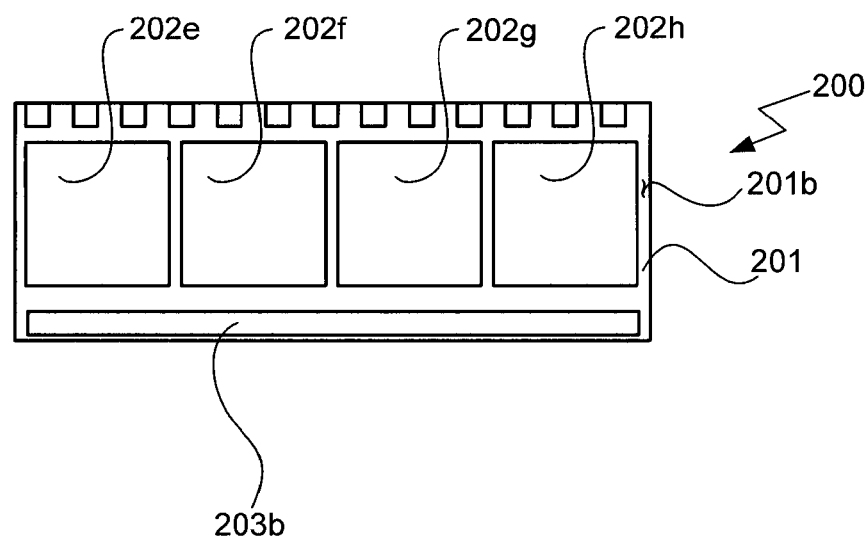
FIG. 2B is a side view of a second side of the semiconductor module shown in FIG. 2A.
Figure 2C:
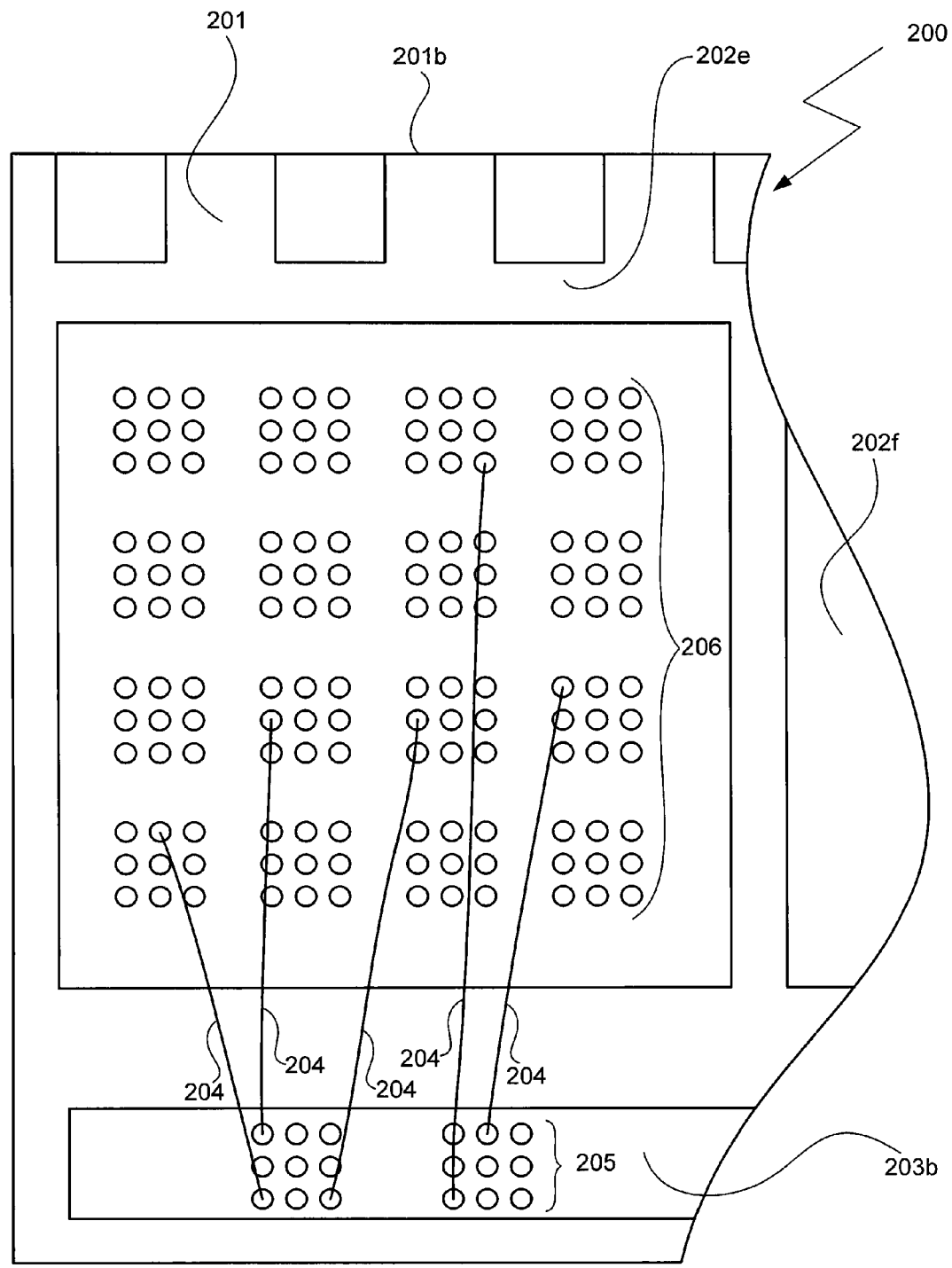
FIG. 2C is a detailed view of a portion of the second side of the semiconductor module shown in FIG. 2B.

A second exemplary embodiment of the present invention, as seen in FIGS. 2A-2C, provides a memory module 200 including a substrate 201 having a first side 201*a* and a second side 201*b*. In some embodiments, the first side 201*a* includes a plurality of memory die 202*a*-202*d* and a single elongate buffer die 203*a*. In some embodiments, the second side 201*b* includes a plurality of memory die 202*e*-202*h* and a single elongate buffer die 203*b*.

The substrate 201 and memory die 202*a*-202*d* are the same as those described above in relation to FIGS. 1A-1D. Again, while eight memory die 202*a*-202*h* are shown for illustrative purposes, it should be appreciated that any number of memory die may be used subject to space limitations on the substrate.

In some embodiments, each of the buffer die 203*a* and 203*b* is a single elongate buffer die, disposed adjacent multiple memory die 202*a*-202*d* or 202*e*-202*h* and electrically connected to each memory die 202*a*-202*d* or 202*e*-202*h* with interconnections 204 (FIG. 2C). In some embodiments, interconnections 204 electrically couple connectors 205 of buffer die 203 to connectors 206 of memory die 202*e*. In some embodiments, the interconnections 204 include wire bonds, vias, and/or traces as described above. In these embodiments, a single buffer die 203*a* or 203*b* is used for multiple memory die 202*a*-202*d* or 202*e*-202*h*. The interconnections 204 may be designed to have substantially identical lengths or any other desired electrical characteristics, as described above.

Referring to FIG. 2C, in some embodiments, the buffer die 203*b* is disposed nearer those of the memory die connectors 206 that communicate high-speed signals, as described above. For example, in the illustrated embodiment, high-speed connectors 206 such as data pins may be disposed near the bottom of the memory die 202*e* in FIG. 2C, while lower-speed pins such as command pins may be disposed nearer the top of the memory die 202*e* in FIG. 2C, or otherwise away from the buffer die 203*b*.

Figure 3A:
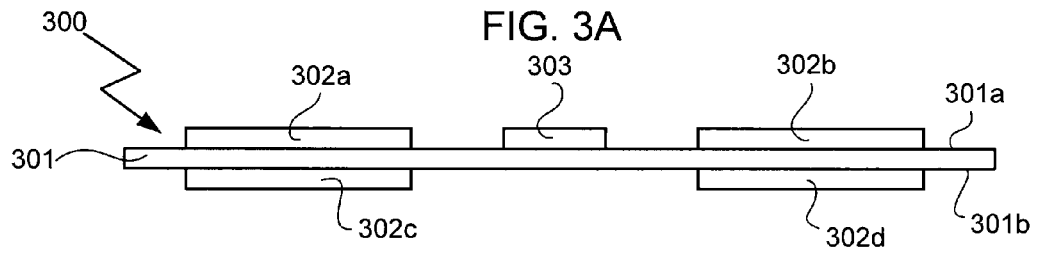
FIG. 3A is a top view of a semiconductor module according to yet another embodiment.
Figure 3B:
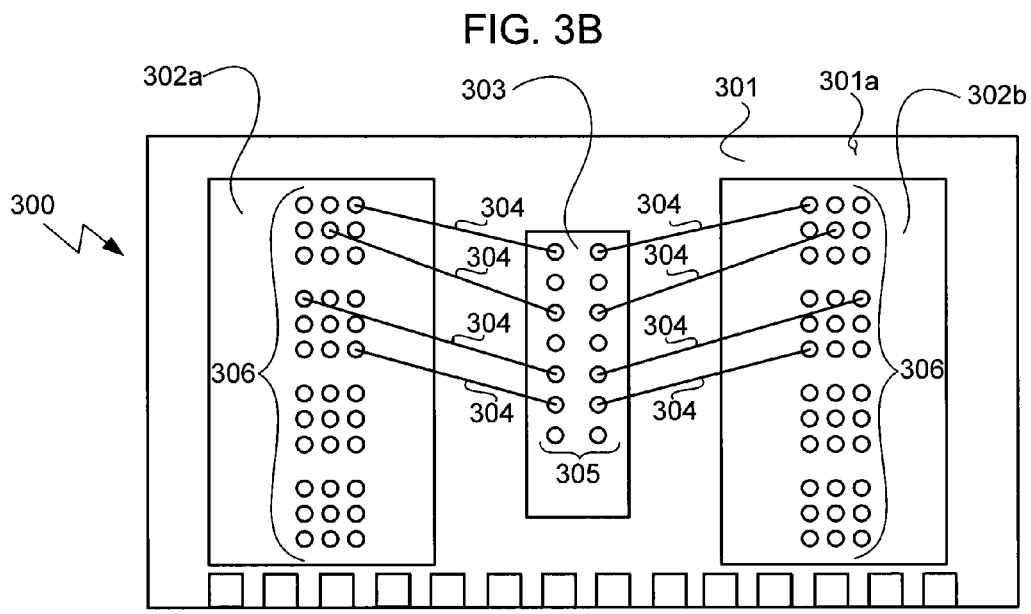
FIG. 3B is a side view of a first side of the semiconductor module shown in FIG. 3A.
Figure 3C:
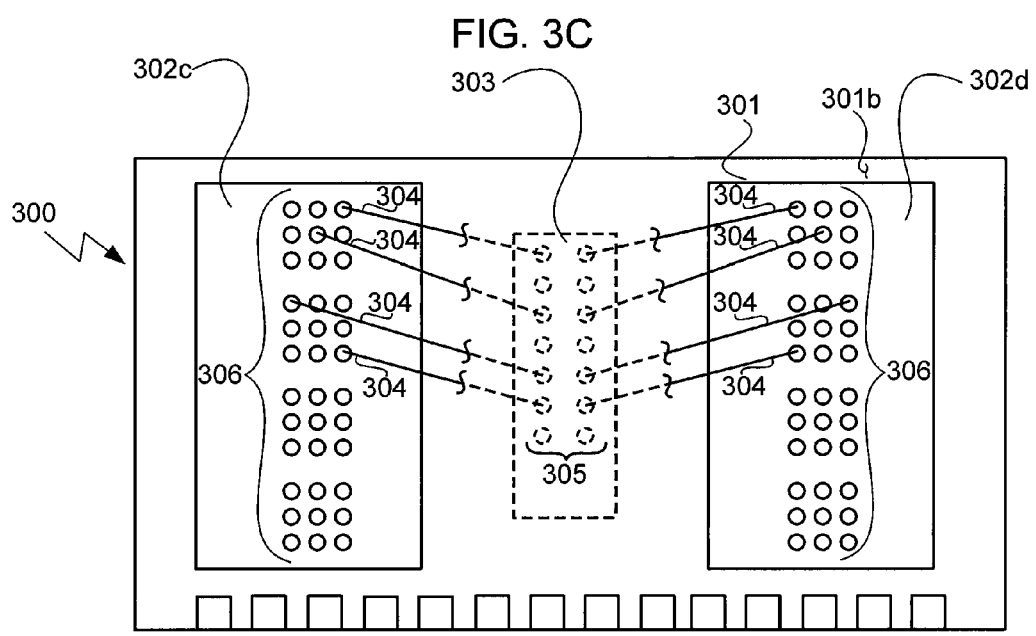
FIG. 3C is a side view of a second side of the semiconductor module shown in FIG. 3A.
Figure 4:
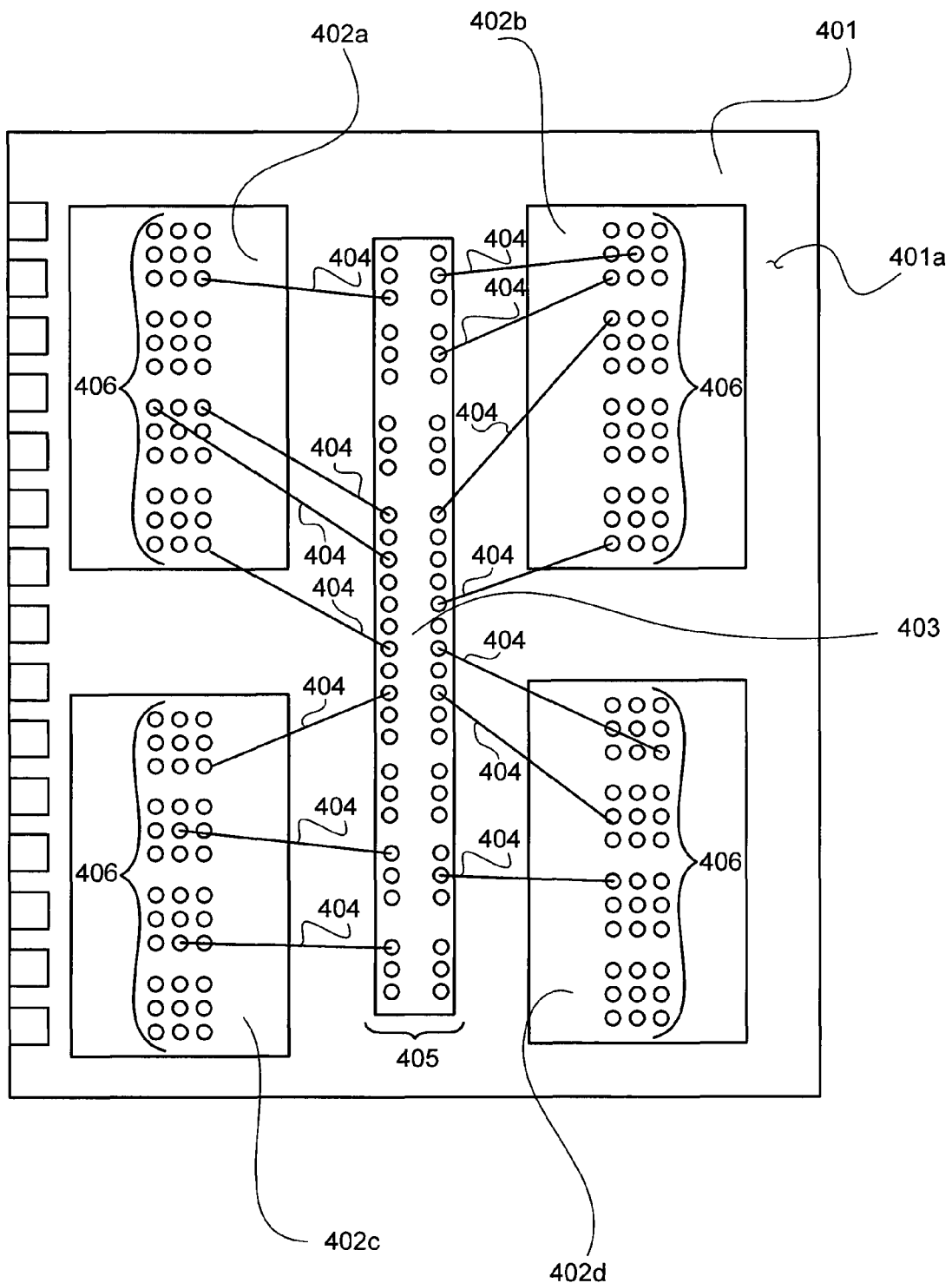
FIG. 4 is a side view of an alternate layout of a semiconductor module according to one other embodiment.

In a third exemplary embodiment, as shown in FIGS. 3A-3C and 4, a memory module 300 (400 in FIG. 4) includes a plurality of memory die 302*a*-302*d* (402*a*-402*d* in FIG. 4) disposed about a single buffer die 303 (403 in FIG. 4). These plurality of memory die 302*a*-302*d* (402*a*-402*d* in FIG. 4) are also electrically connected to the buffer die 303 (403 in FIG. 4).

The substrates 301, 401 and memory die 302*a*-302*d*, 402*a*-402*d* are similar as those described above in relation to FIGS. 1A-1D. Again, while four memory die 302*a*-302*d*, 402*a*-402*d* are shown for illustrative purposes, it should be appreciated that any number of memory die may be used subject to space limitations on the substrate.

In some embodiments, a single buffer die 303, disposed on a first side 301*a* of the substrate 301, is electrically connected to the multiple memory die 302*a*-302*d* disposed on both sides 301*a*, 301*b* of the substrate 301 by means of interconnections 304 connecting buffer die connectors 305 to memory die connectors 306. In some embodiments, the interconnections 304 include wire bonds, vias, and/or traces as described above. In some embodiments, the interconnections 304 may be designed to have substantially identical lengths or any other desired electrical characteristics, as described above.

In some embodiments, the thickness of the substrate 301 may be factored into the design to ensure similar lengths of the interconnections 304, while in other embodiments, it may be deemed as negligible. FIGS. 3B and 3C illustrate an embodiment where the portions of the lengths of all of the interconnections are the same or similar to each memory die 302*a*-302*d*.

In some embodiments, the buffer die 303 is disposed nearer those of the memory die connectors 306 that communicate high-speed signals, as described above; i.e., in the illustrated embodiment, high-speed connectors 306, such as data pins, may be disposed on the right sides of memory die 302*a* and 302*c* and on the left sides of memory die 302*b* and 302*d*, as shown in FIGS. 3A-3C, while lower-speed pins, such as command pins, may be disposed on the left sides of memory die 302*a* and 302*c* and on the right sides of memory die 302*b* and 302*d*, or otherwise away from the buffer die 303.

In an alternate layout, as shown in FIG. 4, multiple memory die 402*a*-402*d* and a buffer die 403 may be disposed on a single surface 401*a* of a substrate 401. Connectors 405 and 406 may be electrically connected to one another though interconnections 404. In some embodiments, the interconnections 404 include wire bonds, vias, and/or traces as described above. In some embodiments, the interconnections 404 may be designed to have substantially identical lengths or any other desired electrical characteristics, as described above. The memory die connectors 406 that utilize high-speed signals, such as data pins, may be centrally situated, i.e., in the illustrated embodiment, at the right of memory die 402*a*, 402*c*, and the left of memory die 402*b*, 402*d*, while lower-speed connectors 406 such as command pins may be disposed away from these central edges or otherwise further away from the buffer die 403.

The preceding description sets forth various implementations and embodiments. The implementations and embodiments described incorporate various elements and/or operations recited in the appended claims. The implementations and embodiments are described with specificity in order to meet statutory requirements. However, the description itself is not intended to limit the scope of this patent. Rather, the inventors have contemplated that the claimed invention might also be implemented in other ways, to include different elements and/or operations or combinations of elements and/or operations similar to the ones described in this document, in conjunction with other present or future technologies.

What is claimed is:

1. A semiconductor module comprising:
   a substrate having first and second sides;
   at least one first memory die mechanically coupled to the first side of the substrate;

at least one second memory die mechanically coupled to the second side of the substrate; and a buffer die mechanically coupled to the first side of the substrate and electrically connected to the first and second memory die through interconnections of substantially the same length.

2. The module of claim 1, wherein the substrate is substantially planar.

3. The module of claim 1, wherein at least some of the interconnections between the buffer die and the at least one second memory die include vias extending through the substrate.

4. The module of claim 3, wherein at least two of the plurality of vias have substantially identical lengths.

5. The module of claim 4, wherein the lengths are approximately 05-2.0 mm.

6. The module of claim 1, wherein the buffer die is a micro-buffer.

7. The module of claim 1, wherein at least one of the at least one first memory die is a DRAM.

8. A method of packaging a plurality of memory die, comprising:

mounting a number of memory die to a first side of a substrate, wherein the substrate has first and second sides;

mounting an equal number of buffer die to a second side of the substrate such that each of the memory die is disposed substantially opposite to one of the buffer die; and electrically coupling each of the memory die to the buffer die that is disposed opposite the memory die by providing a plurality of vias extending through the substrate, wherein the electrical characteristics of the vias are substantially the same.

9. The method of claim 8, wherein the substrate is substantially planar.

10. The method of claim 8, wherein at least two of the vias have substantially identical lengths.

11. The method of claim 10, wherein the lengths are approximately 05-2.0 mm.

12. The method of claim 8, wherein the buffer die is a micro-buffer.

13. The method of claim 8, wherein at least one of the memory die is a DRAM.

* * * * *